US011804263B2

(12) United States Patent
Ha

(10) Patent No.: US 11,804,263 B2
(45) Date of Patent: Oct. 31, 2023

(54) SEMICONDUCTOR DEVICE AND METHOD OF OPERATING THE SAME

(71) Applicant: SK hynix Inc., Icheon-si (KR)

(72) Inventor: Tae Jung Ha, Icheon-si (KR)

(73) Assignee: SK HYNIX INC., Icheon-si (KR)

(\*) Notice: Subject to any disclaimer, the term of this patent is extended or adjusted under 35 U.S.C. 154(b) by 0 days.

(21) Appl. No.: 17/365,306

(22) Filed: Jul. 1, 2021

(65) Prior Publication Data

US 2022/0215876 A1    Jul. 7, 2022

(30) Foreign Application Priority Data

Jan. 5, 2021   (KR) .................. 10-2021-0001136

(51) Int. Cl.
*G11C 11/56* (2006.01)
*G11C 13/00* (2006.01)
(Continued)

(52) U.S. Cl.
CPC ........ *G11C 11/5685* (2013.01); *G11C 13/004* (2013.01); *G11C 13/0007* (2013.01);
(Continued)

(58) Field of Classification Search
CPC . G11C 11/5685; G11C 13/007; G11C 13/004; G11C 13/0069; G11C 2213/32;
(Continued)

(56) References Cited

U.S. PATENT DOCUMENTS 9,142,289 B2    9/2015  Takagi et al.
10,388,869 B2 \*  8/2019  Majhi ................. H01L 45/1226
(Continued)

FOREIGN PATENT DOCUMENTS

JP    2001267432 A  \*  9/2001  ......... H01L 21/8249
KR    100969807 B1      7/2010
(Continued)

OTHER PUBLICATIONS

Fursenko, O. et al., "Optical properties and band gap characterization of high dielectric constant oxides." Thin Solid Films 520 (2012), pp. 4532-4535.

*Primary Examiner* — Fernando Hidalgo
(74) *Attorney, Agent, or Firm* — Perkins Coie LLP

(57) ABSTRACT

A semiconductor device may include a word line, a bit line crossing the word line, and a memory cell coupled to the word line and the bit line to receive an electrical signal to control the memory cell and including a switching material layer and an oxidation-reduction reversible material layer that is in contact with the switching material layer to allow for either oxidation reaction or reduction reaction to occur in response to different amplitudes and different polarities of the electrical signal, wherein the oxidation-reduction reversible material layer and the switching material layer responds to a first threshold voltage and a first polarity of the electrical signal to generate an oxidation interface between the switching material layer and the oxidation-reduction reversible material layer, and responds to a second threshold voltage and a second polarity of the electrical signal to reduce the generation of the oxidation interface.

15 Claims, 12 Drawing Sheets

(51) Int. Cl.
*H10N 70/20* (2023.01)
*H10N 70/00* (2023.01)

(52) U.S. Cl.
CPC ......... *G11C 13/0069* (2013.01); *H10N 70/24* (2023.02); *H10N 70/8833* (2023.02); *G11C 2213/32* (2013.01)

(58) Field of Classification Search
CPC ...... G11C 2013/0073; G11C 2013/009; G11C 2213/71; G11C 2213/77; G11C 5/063; H01L 45/08; H01L 45/146; H01L 27/2409; H01L 27/2463; H01L 27/249; H01L 45/10; H01L 45/1233; H01L 27/24; H01L 45/145; H01L 27/2481; Y02D 10/00; H10N 70/24; H10N 70/8833; H10N 70/25; H10N 70/826; H10N 70/883; H10B 63/20; H10B 63/80; H10B 63/845; H10B 63/00; H10B 63/84

USPC .......................................................... 365/148
See application file for complete search history.

(56) References Cited

U.S. PATENT DOCUMENTS

2020/0161372 A1\* 5/2020 Beckmann .......... H01L 45/1641
2020/0321354 A1\* 10/2020 Yoo ..................... G11C 11/2257

FOREIGN PATENT DOCUMENTS

| KR | 20090108221 A | \* | 7/2010 |
| KR | 1020080033526 | \* | 7/2010 |
| KR | 101323779 B1 | | 10/2013 |

\* cited by examiner

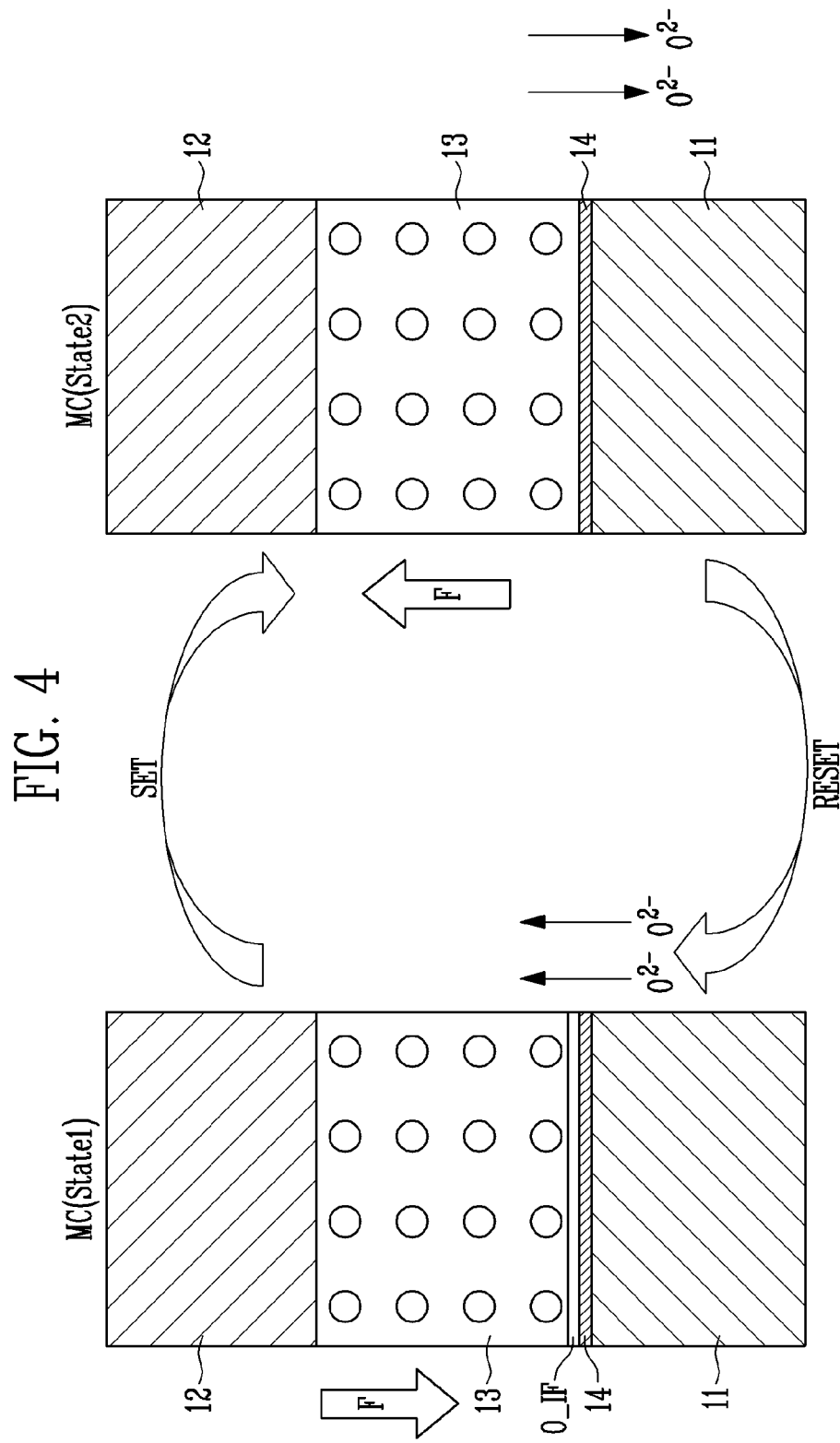

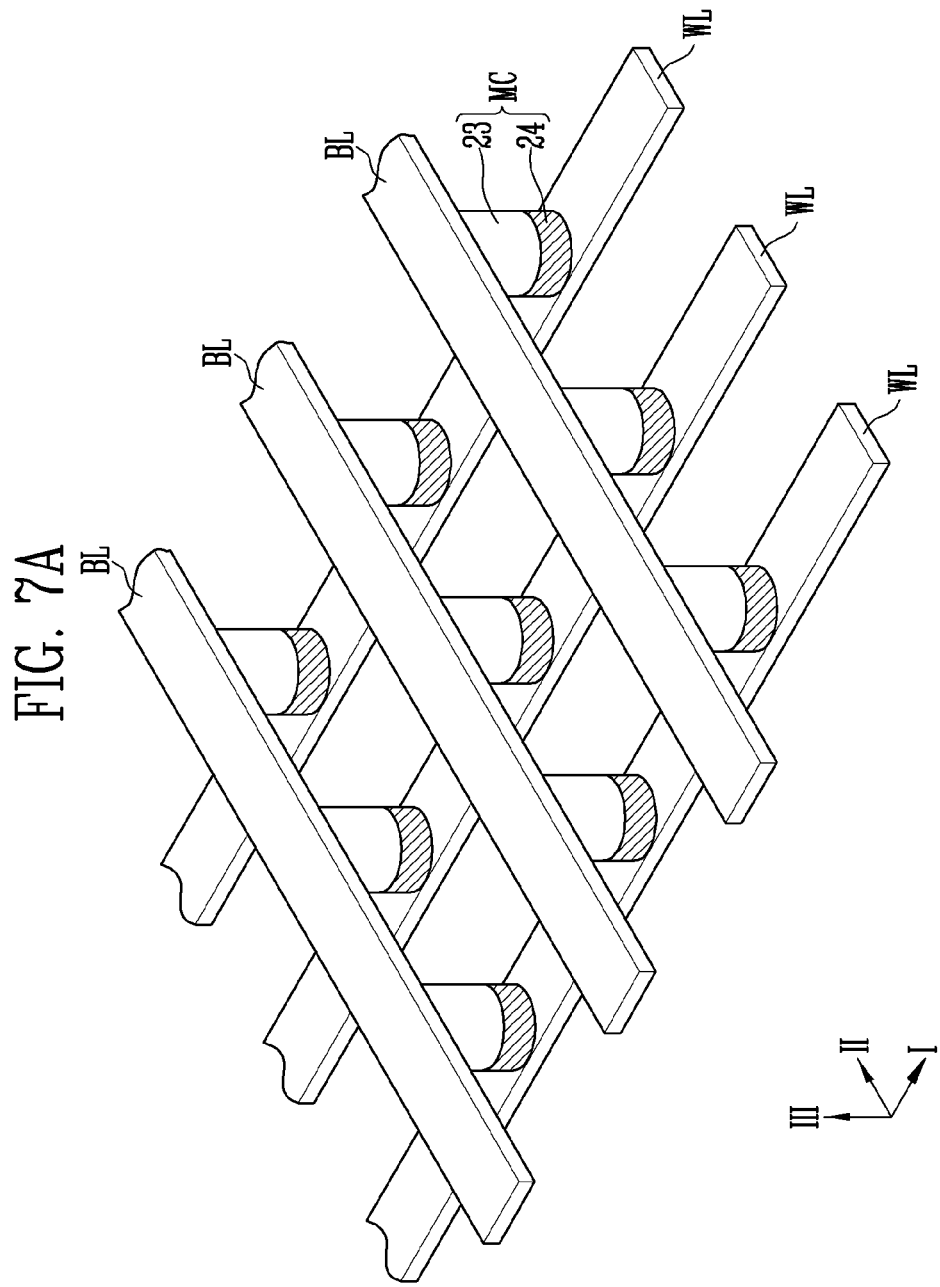

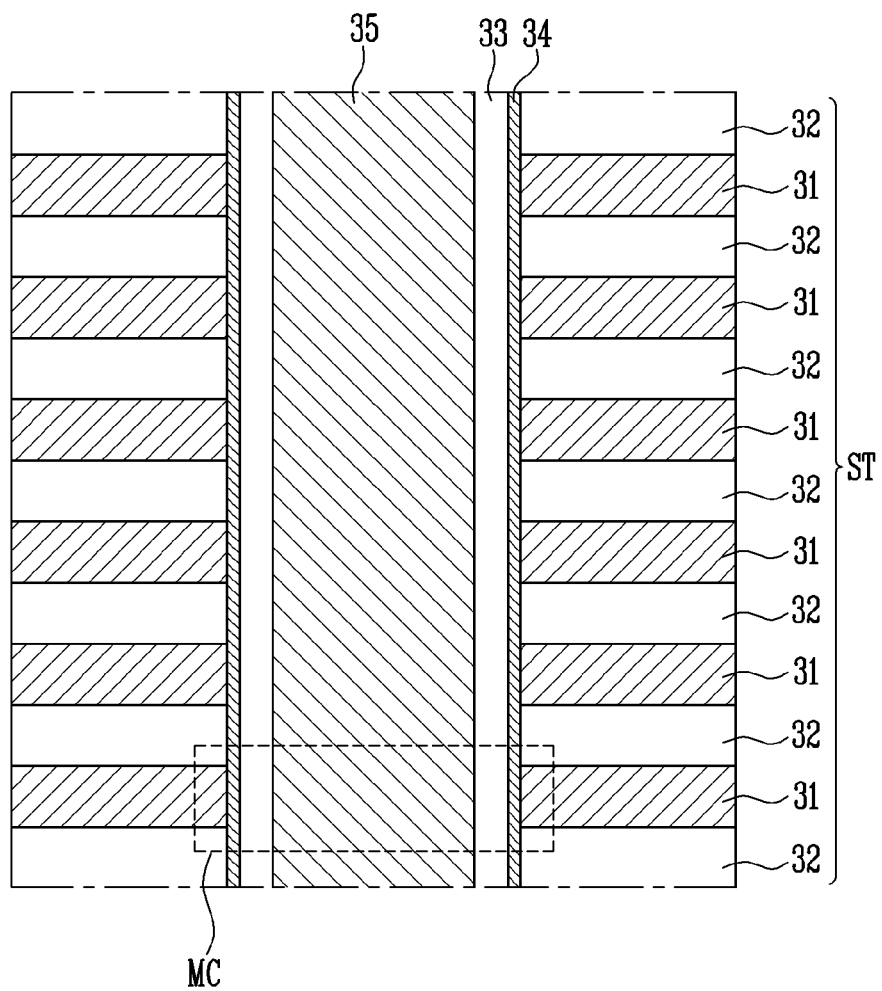

SEMICONDUCTOR DEVICE AND METHOD OF OPERATING THE SAME

CROSS-REFERENCE TO RELATED APPLICATION

This patent document claims priority to and benefits of the Korean patent application number 10-2021-0001136, filed Jan. 5, 2021, which is incorporated herein by reference in its entirety.

TECHNICAL FIELD

The technology and implementations disclosed in this patent document relate to an electronic device including a semiconductor device and a method of operating the same.

BACKGROUND

In recent years, a semiconductor device capable of storing information in various electronic devices such as a computer and a portable communication device has been demanded, according to miniaturization, low power consumption, high performance, and diversification of an electronic device. Therefore, study on a semiconductor device capable of storing data by using a switching characteristic between different resistance states according to an applied voltage or current. Examples of such a semiconductor device include a resistive random access memory (RRAM), a phase-change random access memory (PRAM), a ferroelectric random access memory (FRAM), a magnetic random access memory (MRAM), an e-fuse, and the like.

SUMMARY

An embodiment of the present disclosure provides a semiconductor device and a method of operating the same capable of improving an operation characteristic and reliability of a memory cell.

In one aspect, a semiconductor device is provided to include a word line; a bit line crossing the word line; and a memory cell coupled between the word line and the bit line and including a switching material layer and an oxidation-reduction reversible material layer, wherein the memory cell has a first threshold voltage when an oxidation interface is generated between the switching material layer and the oxidation-reduction reversible material layer, and has a second threshold voltage different from the first threshold voltage when the oxidation interface dissipates.

In another aspect, a semiconductor device may include a word line, a bit line crossing the word line, and a memory cell coupled to the word line and the bit line to receive an electrical signal to control the memory cell and including a switching material layer and an oxidation-reduction reversible material layer that is in contact with the switching material layer to allow for either oxidation reaction or reduction reaction to occur in response to different amplitudes and different polarities of the electrical signal, wherein the oxidation-reduction reversible material layer and the switching material layer responds to a first threshold voltage and a first polarity of the electrical signal to generate an oxidation interface between the switching material layer and the oxidation-reduction reversible material layer, and responds to a second threshold voltage and a second polarity of the electrical signal to reduce the generation of the oxidation interface.

In another aspect, a method of operating a semiconductor device is provided. The method includes performing a reset operation of changing a threshold voltage of a memory cell from a second threshold voltage to a first threshold voltage higher than the second threshold voltage, by applying a reset voltage of a first polarity to the memory cell, wherein the memory cell is coupled to a word line and a bit line and including a switching material layer and an oxidation-reduction reversible material layer and an oxidation interface is generated between the switching material layer and the oxidation-reduction reversible material layer in response to the reset voltage, and performing a set operation of changing the threshold voltage of the memory cell from the first threshold voltage to the second threshold voltage by applying a set voltage of a second polarity different from the first polarity to the memory cell, wherein the oxidation interface is dissipated in response to the set voltage.

An integration degree, an operation characteristic, and reliability of a semiconductor device can be improved.

BRIEF DESCRIPTION OF THE DRAWINGS

FIG. 4 is a diagram illustrating an example of an operation of a semiconductor device based on an embodiment of the disclosed technology.

FIGS. 7A and 7B are diagrams illustrating a structure of a semiconductor device based on an embodiment of the disclosed technology.

DETAILED DESCRIPTION

Specific structural or functional descriptions of embodiments of the disclosed technology are discussed with reference to the drawings. The disclosed technology may be carried out in various forms and are not limited to the embodiments described in the present specification or application.

Figure 1:
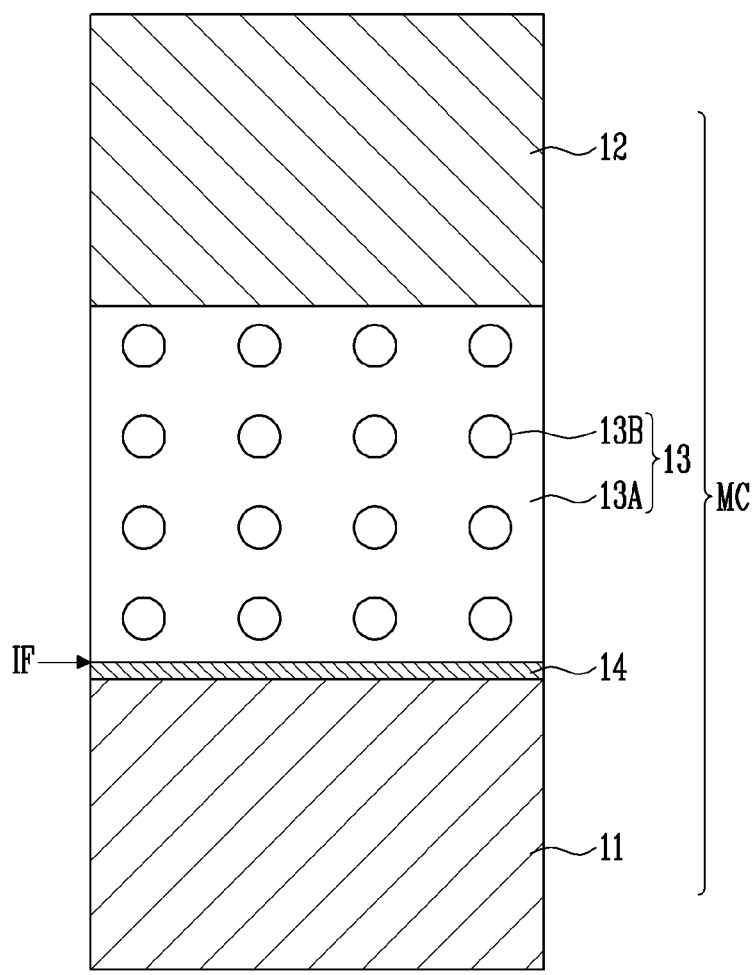
FIG. 1 illustrates an example of a structure of a semiconductor device based on an embodiment of the disclosed technology.

FIG. 1 is a diagram illustrating a structure of a semiconductor device according to an embodiment of the disclosed technology.

Referring to FIG. 1, the semiconductor device may include a memory cell MC. The memory cell MC may include a first electrode 11, a second electrode 12, a switching material layer 13, and an oxidation-reduction reversible material layer 14.

The switching material layer 13 may be positioned between the first electrode 11 and the second electrode 12. The switching material layer 13 may include an insulating layer 13A which may be or include an oxide layer. The insulating layer 13A may include a material having an energy band gap of 7 eV or more. The insulating layer 13A may include $SiO_2$, $Al_2O_3$, $TiO_2$, or $ZrO_2$, or may include a combination thereof.

The switching material layer 13 may further include a dopant 13B. The dopant 13B may be injected into the insulating layer 13A by various methods, for example, an ion injection method. The insulating layer 13A may include a trap caused by the dopant 13B, and thus may have a switching characteristic. The dopant 13B may include boron (B), carbon (C), nitrogen (N), aluminum (Al), phosphorus (P), arsenic (As), silicon (Si), or germanium (Ge), or a combination thereof. A dopant concentration of the switching material layer 13 may be 1E14 to 1E17 at/cm$^2$. A thickness of the switching material layer 13 may be 5 to 200 Å.

The oxidation-reduction reversible material layer 14 may be interposed between the first electrode 11 and the switching material layer 13. The oxidation-reduction reversible material layer 14 may be interposed between a word line and the switching material layer 13 or between a bit line and the switching material layer 13. An interface IF may exist between the oxidation-reduction reversible material layer 14 and the switching material layer 13. At the interface IF, an oxidation reaction and a reduction reaction may occur reversibly without a damage of the oxidation-reduction reversible material layer 14 or the switching material layer 13.

The oxidation-reduction reversible material layer 14 includes a material that allows both oxidation reaction and reduction reaction to occur. The oxidation-reduction reversible material layer 14 may include a metal layer. In an embodiment, the oxidation-reduction reversible material layer 14 may include tantalum (Ta), hafnium (Hf), aluminum (Al), strontium (Sr), or ruthenium (Ru), or may include a combination thereof.

As will be further discussed with reference to FIGS. 2A to 3B, the combined structure of the switching material layer 13 and the oxidation-reduction reversible material layer 14 between the electrodes 11 and 12 in the memory cell in FIG. 2A can be applied with electric fields of different electric polarities across the electrodes 11 and 12 to switch the resistive states of the combined structure and thus use the different resistive states to store data. More specifically, the use of the combined structure of the switching material layer 13 and the oxidation-reduction reversible material layer 14 enables both the oxidation reaction and the reduction reaction to occur at the interface IF to achieve the different resistive states as logic states for storing data by applying desired voltages having different polarities to the memory cell MC.

The first electrode 11 may be electrically connected to the word line and the second electrode 12 may be electrically connected to the bit line. Alternatively, the first electrode 11 may be electrically connected to the bit line and the second electrode 12 may be electrically connected to the word line. The first electrode 11 or the second electrode 12 may include a conductive material such as metal or metal nitride. The first electrode 11 or the second electrode 12 may include tungsten (W), tungsten nitride (WN), tungsten silicide (WSi), tungsten silicon nitride (WSiN), titanium (Ti), titanium nitride (TiN), titanium silicon nitride (TiSiN), titanium aluminum nitride (TiAlN), tantalum (Ta), tantalum nitride (TaN), tantalum silicon nitride (TaSiN), tantalum aluminum nitride (TaAlN), carbon (C), carbon nitride (CNx), silicon carbide (SiC), silicon carbon nitride (SiCN), copper (Cu), zinc (Zn), nickel (Ni), cobalt (Co), lead (Pd), or platinum (Pt), or may include a combination thereof.

According to the structure as described above, an oxidation interface may be generated or dissipated at the interface IF as a program operation or an erase operation is performed on the memory cell MC. A threshold voltage of the memory cell MC may be changed by the generation or dissipation of the oxidation interface, and thus logic states may be stored in the memory cell MC. Here, the threshold voltage may be a voltage at which the memory cell MC is turned on. According to such a method, the memory cell MC may not be required to include both of a select element and a memory element, and may implement both of a switching function and a memory function with one element.

In an embodiment, both of the switching function and the memory function may be implemented only with the select element. In such a case, since a manufacturing process of the memory element may be omitted, the manufacturing process may be simplified. An aspect ratio of a stack material for forming the memory cell MC may be reduced, and a level of difficulty of an etching process, a hard mask process, or the like may be lowered. Since the memory element is omitted, a lead window may be widened, and an operation speed of the memory cell MC may be improved.

Figure 2A:
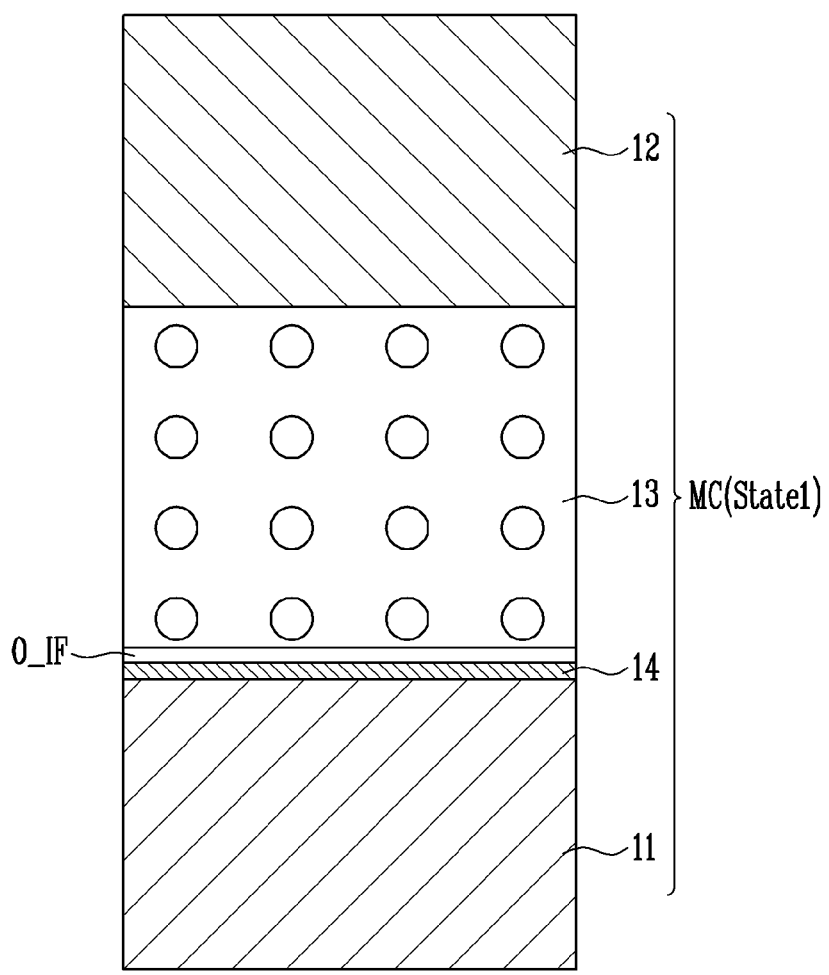
FIG. 2A illustrates an example of a structure of a semiconductor based on an embodiment of the disclosed technology.
Figure 2B:
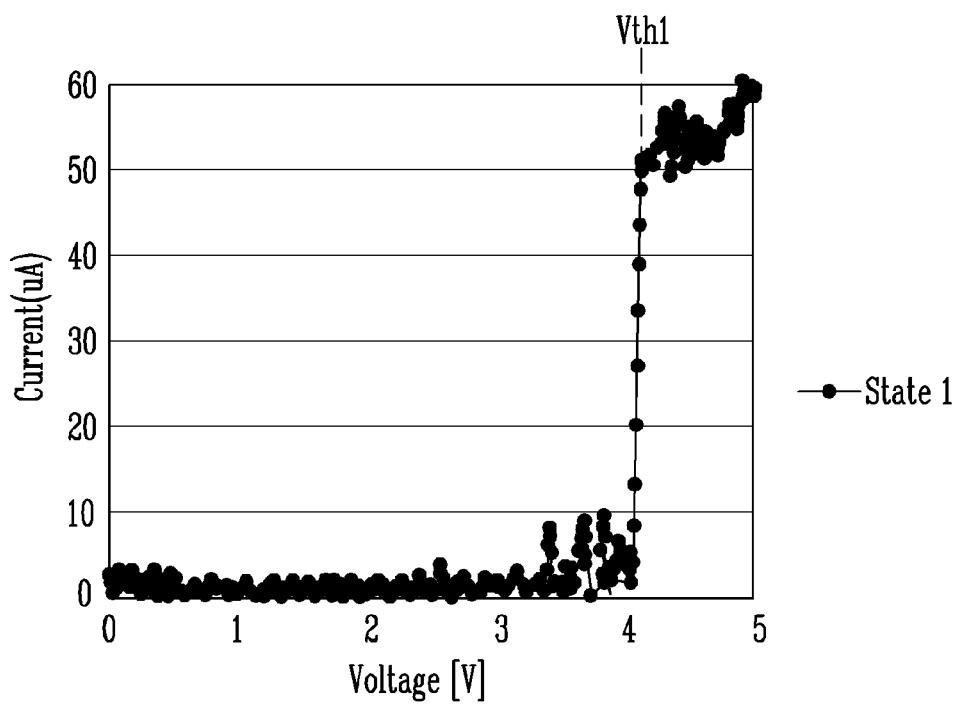
FIG. 2B shows a graph illustrating a characteristic of a semiconductor device based on an embodiment of the disclosed technology.

FIGS. 2A and 2B are diagrams illustrating a characteristic of a semiconductor device based on an embodiment of the disclosed technology. FIG. 2A is a cross-sectional view illustrating a structure of a memory cell, and FIG. 2B is a graph illustrating a characteristic of a memory cell. Hereinafter, contents repetitive to the previously described contents are omitted.

Referring to FIG. 2A, the memory cell MC includes a first electrode 11, a second electrode 12, a switching material layer 13, and an oxidation-reduction reversible material layer 14. FIG. 2A shows that the memory cell MC includes an oxidation interface O_IF between the switching material layer 13 and the oxidation-reduction reversible material layer 14. The oxidation interface O_IF may be generated when the oxidation reaction occurs at the interface IF between the oxidation-reduction reversible material layer 14 and the switching material layer 13 and dissipated when the reduction reaction occurs at the interface IF between the oxidation-reduction reversible material layer 14 and the switching material layer 13.

The oxidation interface O_IF may have a uniform oxygen concentration across the oxidation interface O_IF or may have different oxygen concentrations based on the region of the oxidation interface O_IF. In an embodiment, the oxidation interface O_IF may include a first surface facing the switching material layer 13 and a second surface facing the oxidation-reduction reversible material layer 14. A portion of the oxidation interface O_IF close to the first surface may have a higher oxygen concentration than a portion close to the second surface. In the oxidation interface O_IF, the oxygen concentration may gradually decrease from the first surface to the second surface.

The memory cell MC in which the oxidation interface O_IF is generated may have a threshold voltage different from that of the memory cell MC in which the oxidation interface O_IF is dissipated. The memory cell MC in which the oxidation interface O_IF is generated may have a first threshold voltage Vth1 and may store a first logic state state1. In an embodiment, the first logic state state1 may be a reset state.

FIG. 2B illustrates a voltage-current characteristic of the memory cell MC in which the first logic state state1 is stored. An x-axis represents a voltage applied to the switching material layer 13 between the electrodes 11 and 12 and a y-axis represents a current flowing through the switching material layer between the electrodes 11 and 12. As illustrated, the memory cell MC in which the first logic state state1 is stored may be turned on at a first threshold voltage Vth1. The first threshold voltage Vth1 may be about 4V in the specific example shown in FIG. 2B.

Figure 3A:
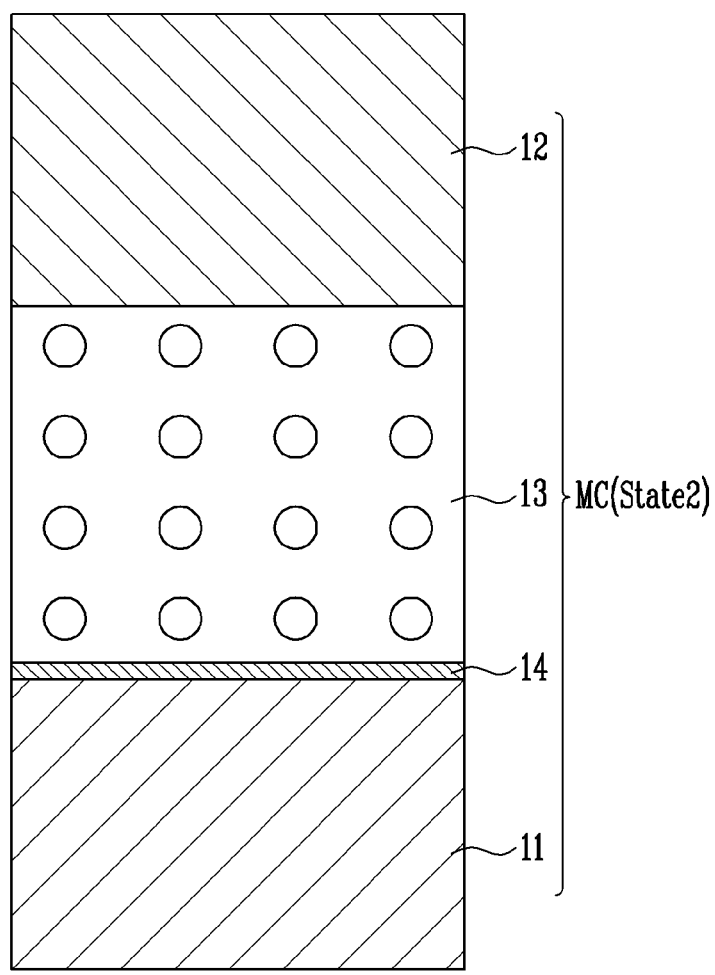
FIG. 3A illustrates an example of a structure of a semiconductor based on an embodiment of the disclosed technology.
Figure 3B:
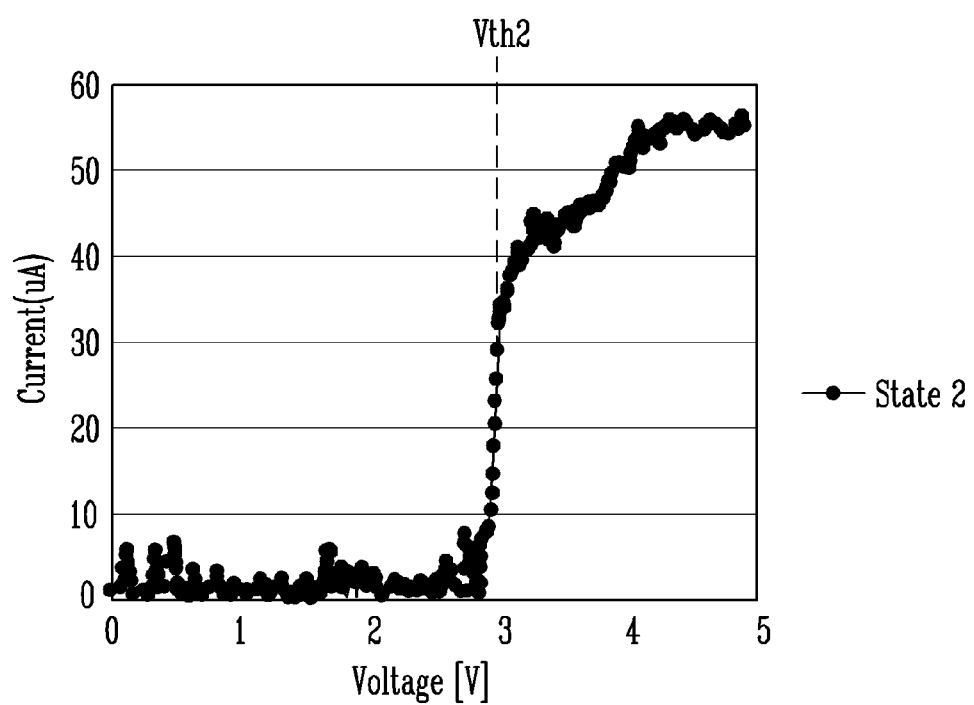
FIG. 3B shows a graph illustrating a characteristic of a semiconductor device based on an embodiment of the disclosed technology.

FIGS. 3A and 3B are diagrams illustrating a characteristic of a semiconductor device based on an embodiment of the disclosed technology. FIG. 3A is a cross-sectional view illustrating a structure of a memory cell, and FIG. 3B is a graph illustrating a characteristic of a memory cell. The descriptions that have been discussed with reference to FIGS. 1 to 2B are omitted in explaining FIGS. 3A and 3B.

Referring to FIG. 3A, the memory cell MC includes a first electrode 11, a second electrode 12, a switching material layer 13, and an oxidation-reduction reversible material layer 14. As compared to FIG. 2A, the memory cell MC as shown in FIG. 3A is different by not including the oxidation interface O_IF in FIG. 2A. As discussed above, the oxidation interface O_IF may be generated when the oxidation reaction occurs at the interface IF between the oxidation-reduction reversible material layer 14 and the switching material layer 13 and dissipated when the reduction reaction occurs at the interface IF between the oxidation-reduction reversible material layer 14 and the switching material layer 13.

The memory cell MC in which the oxidation interface is dissipated may have a second threshold voltage Vth2. The second threshold voltage Vth2 may have a level lower than that of the first threshold voltage Vth1. An absolute value of the second threshold voltage Vth2 may be less than an absolute value of the first threshold voltage Vth1. A second logic state state2 may be stored in the memory cell MC by changing the threshold voltage of the memory cell MC from the first threshold voltage Vth1 to the second threshold voltage Vth2. In an embodiment, the second logic state state2 may be a set state.

FIG. 3B illustrates a voltage-current characteristic of the memory cell MC in which the second logic state state2 is stored. An x-axis represents a voltage applied to the switching material layer 13 between the electrodes 11 and 12 and a y-axis represents a current flowing through the switching material layer 13 between the electrodes 11 and 12. Referring to a graph, the memory cell MC in which the second logic state state2 is stored may be turned on at the second threshold voltage Vth2. The second threshold voltage Vth2 may be about 3V in the specific example shown in FIG. 3B.

FIG. 4 is a diagram illustrating an operation of a semiconductor device according to an embodiment of the disclosed technology.

Referring to FIG. 4, the threshold voltage of the memory cell MC may be changed by performing a reset operation RESET or a set operation SET on the memory cell MC. The change of the threshold voltage may be due to the generation or dissipation of the oxidation interface O_IF by the oxidation reaction or the reduction reaction of the oxidation-reduction reversible material layer 14.

The first logic state state1 may be stored in the memory cell MC by performing the reset operation RESET on the memory cell MC. The memory cell MC in which the first logic state state1 is stored may have the first threshold voltage Vth1. The threshold voltage of the memory cell MC may be changed from the second threshold voltage Vth2 to the first threshold voltage Vth1 by the reset operation RESET.

During the reset operation RESET, a reset voltage of a first polarity may be applied to the memory cell MC. The first polarity may have a positive polarity. When the reset voltage of the first polarity is applied to the memory cell MC, an electric field F may be formed in a direction from the second electrode 12 to the first electrode 11. Accordingly, an oxygen ion $O^{2-}$ may move from the first electrode 11 to the second electrode 12. In an embodiment, the electric field F may be formed in a direction from the bit line to the word line, and the oxygen ion $O^{2-}$ may move in a direction from the word line to the bit line.

The oxidation-reduction reversible material layer 14 may be oxidized as the oxygen ion $O^{2-}$ moves by the reset operation RESET. The interface between the switching material layer 13 and the oxidation-reduction reversible material layer 14 may be oxidized, and the oxidation interface O_IF may be generated between the switching material layer 13 and the oxidation-reduction reversible material layer 14. Therefore, the threshold voltage of the memory cell MC increases, and the memory cell MC of the reset state has a relatively high threshold voltage.

The second logic state state2 may be stored in the memory cell MC by performing the set operation SET on the memory cell MC. The memory cell MC in which the second logic state state2 is stored may have the second threshold voltage Vth2. The threshold voltage of the memory cell MC may be changed from the first threshold voltage Vth1 to the second threshold voltage Vth2 by the set operation SET.

During the set operation SET, a set voltage of a second polarity different from the first polarity may be applied to the memory cell MC. The second polarity may have a negative polarity. When the set voltage of the second polarity is applied to the memory cell MC, the electric field F may be formed in a direction from the first electrode 11 to the second electrode 12. Accordingly, an oxygen ion $O^{2-}$ may move from the second electrode 12 to the first electrode 11. In an embodiment, the electric field F may be formed in the direction from the word line to the bit line, and the oxygen ion $O^{2-}$ may move in the direction from the bit line to the word line. The oxygen ion $O^{2-}$ may move from the oxidation interface O_IF to the first electrode 11.

The reduction reaction may occur as the oxygen ion $O^{2-}$ moves by the set operation SET, and the oxidation interface O_IF may be dissipated between the switching material layer 13 and the oxidation-reduction reversible material layer 14. Here, "dissipation" includes both of a case where the oxidation interface O_IF is completely dissipated and a case where the oxidation interface O_IF is partially dissipated. As the oxidation interface O_IF is dissipated, the threshold voltage of the memory cell MC decreases, and the memory cell MC of the set state has a relatively low threshold voltage.

According to the operation method as described above, an oxidation-reduction reaction reversibly occurs according to the polarities of the set voltage and the reset voltage. Since the oxidation interface O_IF is generated or dissipated by the oxidation-reduction reaction, the switching material layer 13 or the oxidation-reduction reversible material layer 14 may not be damaged or damage may be minimized. In addition, the memory cell MC may be programmed to a desired logic state by applying the voltages having different polarities to the memory cell MC. Therefore, data may be stored by changing the threshold voltage of the memory cell MC, and the memory cell MC may be selected without a separate select element.

Figure 5:
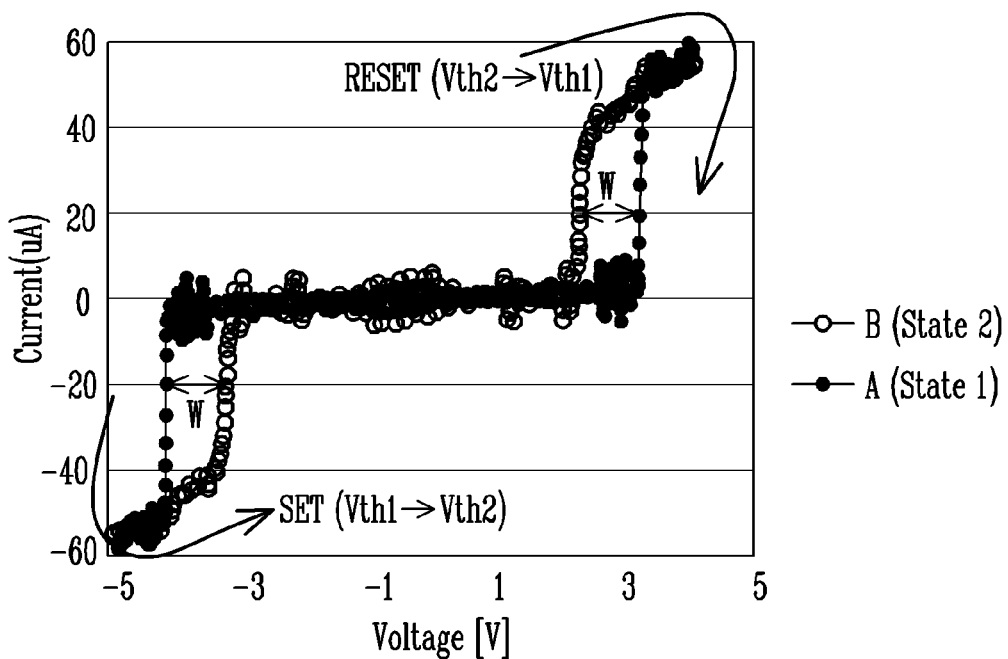
FIG. 5 is a graph illustrating an operation characteristic of a semiconductor device based on an embodiment of the disclosed technology.

FIG. 5 is a graph illustrating an operation characteristic of a semiconductor device according to an embodiment of the disclosed technology. An x-axis may represent a voltage and a y-axis may represent a current. Hereinafter, contents repetitive to the previously described contents are omitted.

In FIG. 5, a curve A represents a voltage-current characteristic of the memory cell in which the first logic state state1 is stored, and a curve B represents a voltage-current characteristic of the memory cell in which the second logic state state2 is stored. In an embodiment, the first logic state state1 may be the reset state, and the second logic state state2 may be the set state.

During the set operation SET, the set voltage of the second polarity is applied to the memory cell having the first logic state state1. Therefore, the turn-on voltage of the memory cell is changed from the first threshold voltage Vth1 to the second threshold voltage Vth2. In an embodiment, the set voltage may have a negative polarity. An absolute value of the set voltage may be equal to or greater than the absolute value of the first threshold voltage Vth1. In an embodiment, the set voltage may be a negative voltage of −4V or more.

During the reset operation RESET, the reset voltage of the first polarity is applied to the memory cell having the second logic state state2. Therefore, the turn-on voltage of the memory cell is changed from the second threshold voltage Vth2 to the first threshold voltage Vth1. In an embodiment, the reset voltage may have a positive polarity. An absolute value of the reset voltage may be equal to or greater than the absolute value of the second threshold voltage Vth2. In an embodiment, the reset voltage may be a positive voltage of 4V or more.

The read operation may be performed using a threshold voltage difference between the memory cell having the first logic state state1 and the memory cell having the second logic state state2. A lead window W may be defined by a difference between the first threshold voltage Vth1 and the second threshold voltage Vth2, and a lead margin equal to the lead window W may be secured.

During the read operation, a read voltage having the first polarity or the second polarity is applied to the memory cell. An absolute value of the read voltage may be equal to or greater than the absolute value of the second threshold voltage Vth2 and less than the absolute value of the first threshold voltage Vth1. In an embodiment, the first threshold voltage Vth1 may be −4V, the second threshold voltage Vth2 may be 3V, and the read voltage may be 3.5V. Data stored in the memory cell may be read by sensing a current flowing through the memory cell after applying the read voltage to the memory cell. In an embodiment, when the sensed current level is equal to or greater than a reference value, it may be determined as the second logic state state2, and when the sensed current level is less than the reference value, it may be determined as the first logic state state1. The reference value may be 10 to 30 μA.

Figure 6:
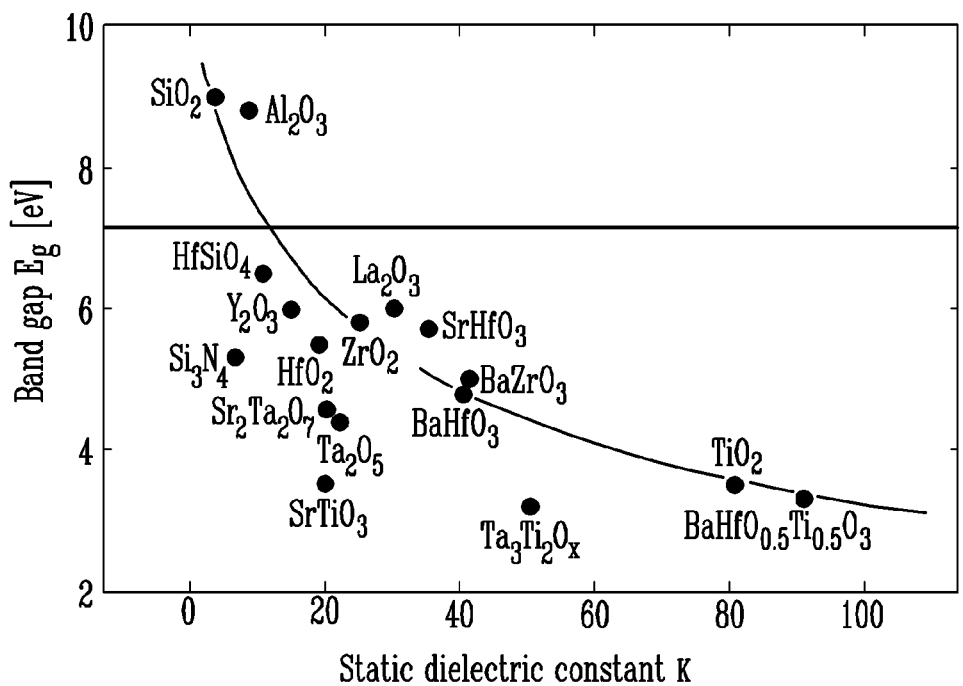
FIG. 6 is a graph illustrating a characteristic of a semiconductor device based on an embodiment of the disclosed technology.

FIG. 6 is a graph illustrating a characteristic of a semiconductor device according to an embodiment of the disclosed technology. Hereinafter, contents repetitive to the previously described contents are omitted.

The graph of FIG. 6 illustrates a static dielectric constant and an energy band gap of various materials. In the graph, an x-axis represents the static dielectric constant, and a y-axis represents the energy band gap. A characteristic of a material may be changed according to the energy band gap. A material having a relatively low energy band gap has a semiconductor or metallic property, and thus the material having the relatively low energy band gap may have a low specific resistance, and may be used as a material of a memory element. A material having a relatively large energy band gap has a small off current (Ioff), and thus the material having the relatively large energy band gap may be used as a material of a switching element.

Therefore, according to an embodiment of the disclosed technology, the material having the relatively large energy band gap is used as the switching material layer 13. In an embodiment, materials having an energy band gap of 7 eV or more may be used as the insulating layer 13A of the switching material layer 13.

FIGS. 7A and 7B are diagrams illustrating a structure of a semiconductor device according to an embodiment of the disclosed technology. Hereinafter, contents repetitive to the previously described contents are omitted.

Referring to FIG. 7A, the semiconductor device may include word lines WL, bit lines BL, and memory cells MC. The word lines WL may extend in a first direction I. The bit lines BL may extend in a second direction II crossing the first direction I. The memory cells MC may be coupled between the word lines WL and the bit lines BL, respectively.

Each of the memory cells MC may include a switching material layer 23 and an oxidation-reduction reversible material layer 24. The oxidation-reduction reversible material layer 24 may be interposed between the switching material layer 23 and the word line WL. In addition, an oxidation interface O_IF may be generated or dissipated between the switching material layer 23 and the oxidation-reduction reversible material layer 24.

Referring to FIG. 7B, the semiconductor device may include a stack ST, a switching material layer 33, an oxidation-reduction reversible material layer 34, and a second conductive layer 35. The stack ST may include alternately stacked first conductive layers 31 and insulating layers 32. The second conductive layer 35 may pass through the stack ST. The second conductive layer 35 may pass through the stack ST in a stack direction of the first conductive layers 31. In an embodiment, the first conductive layers 31 may be the word lines and the second conductive layers 35 may be the bit lines, or the first conductive layers 31 may be the bit lines and the second conductive layers 35 may be the word lines. The memory cell MC may be positioned in a region where the first conductive layers 31 and the second conductive layers 35 cross each other.

The switching material layer 33 may be interposed between the second conductive layer 35 and the first conductive layers 31. In an embodiment, the switching material layer 33 may be formed to surround a sidewall of the second conductive layer 35. The oxidation-reduction reversible material layer 34 may be interposed between the switching material layer 33 and the first conductive layers 31. In an embodiment, the oxidation-reduction reversible material layer 34 may be formed to surround a sidewall of the switching material layer 33. In addition, an oxidation interface O_IF may be generated or dissipated between the switching material layer 33 and the oxidation-reduction reversible material layer 34.

A memory circuit or the semiconductor device of the above-described embodiments may be used in various devices or systems. FIGS. 8 to 11 illustrate some examples of a device or a system that may implement the memory circuit or the semiconductor device of the above-described embodiments.

Figure 8:
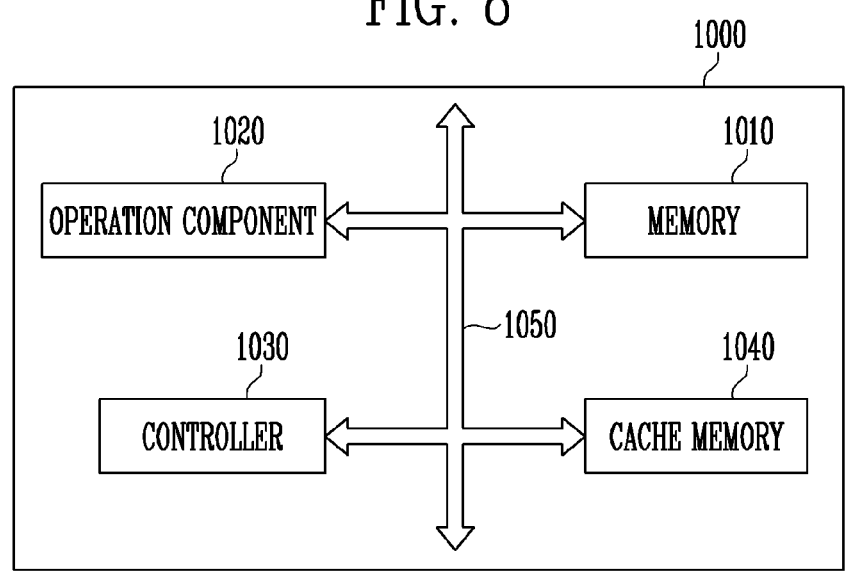
FIG. 8 is an example of a configuration diagram of a microprocessor implementing a memory device based on an embodiment of the disclosed technology.

FIG. 8 is an example of a configuration diagram of a microprocessor implementing a memory device according to an embodiment of the disclosed technology.

Referring to FIG. 8, the microprocessor 1000 may control and adjust a series of processes of receiving data from various external devices, processing the data, and transmitting a result of the process to the external device, and may include a memory 1010, an operating component 1020, a controller 1030, and the like. The microprocessor 1000 may be various data processing devices such as a central processing unit (CPU), a graphic processing unit (GPU), and a digital signal processor (DSP), an application processor.

The memory 1010 may be a processor register, a register, or the like, may store data in the microprocessor 1000, may include various resistors such as a data register, an address register, and a floating point register. The memory 1010 may temporarily store addresses at which data for performing an operation in the operating component 1020, data of a result of the performance, and data for the performance are stored.

The memory 1010 may include one or more embodiments of the semiconductor device described above. For example, the memory 1010 may include one or more memory elements. The memory element may include a word line, a bit line crossing the word line, and a memory cell coupled between the word line and the bit line and including a switching material layer and an oxidation-reduction reversible material layer. The memory cell may have a first threshold voltage when an oxidation interface is generated between the switching material layer and the oxidation-reduction reversible material layer, and have a second threshold voltage different from the first threshold voltage when the oxidation interface dissipates. Therefore, reliability of the memory 1010 may be improved and a manufacturing process may be improved. As a result, an operation characteristic of the microprocessor 1000 may be improved.

The operating component 1020 may perform various arithmetic operations or logical operations according to a result obtained by decoding an instruction by the controller 1030. The operating component 1020 may include one or more arithmetic and logic units (ALUs) and the like.

The controller 1030 may receive a signal from an external device such as the memory 1010, the operating component 1020, and the microprocessor 1000, perform extraction or decoding of an instruction and control of a signal input/output of the microprocessor 1000, and the like, and execute a process indicated by a program.

The microprocessor 1000 according to the present embodiment may further include a cache memory 1040 capable of temporarily storing data input from an external device or data to be output to an external device, in addition to the memory 1010. In this case, the cache memory 1040 may exchange data with the memory 1010, the operating component 1020, and the controller 1030 through a bus interface 1050.

Figure 9:
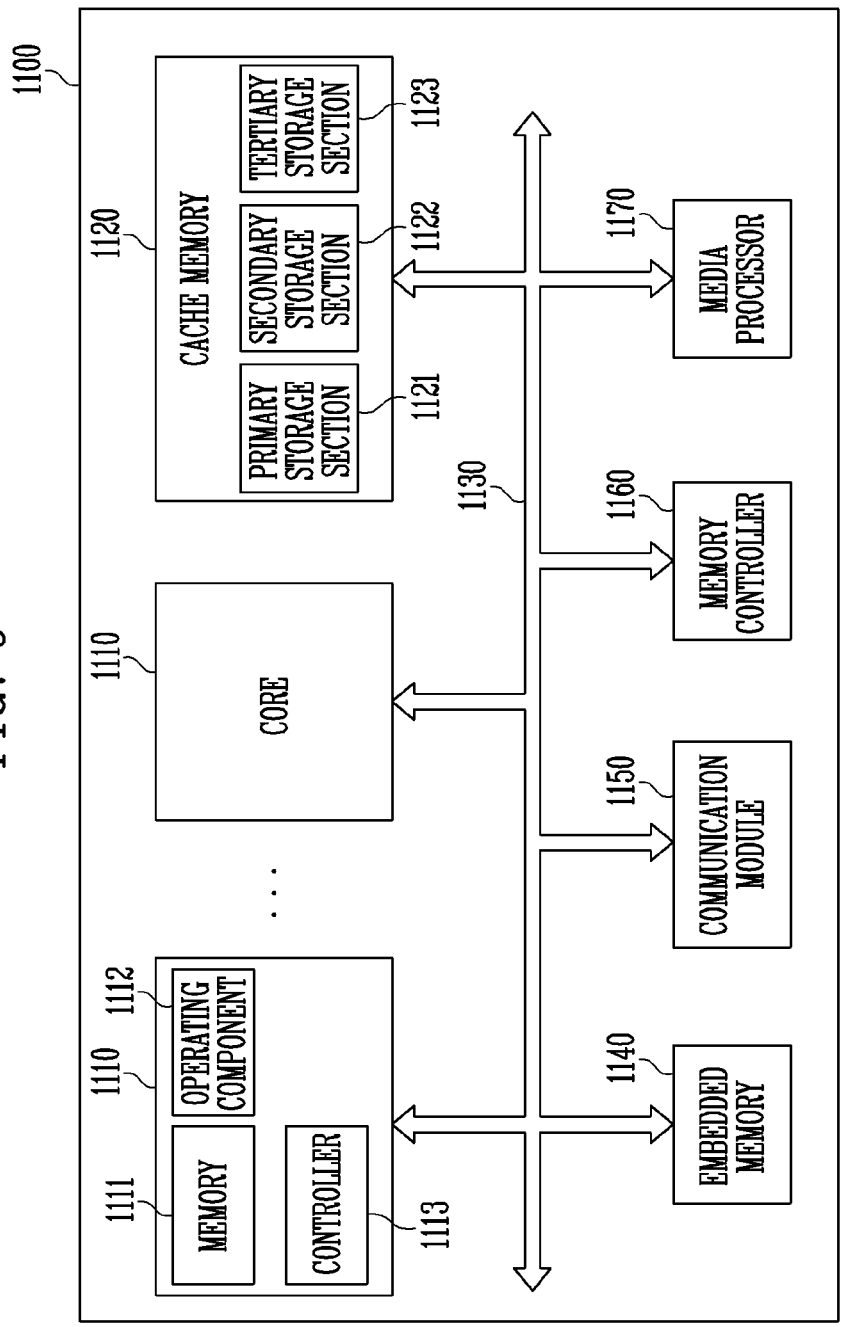
FIG. 9 is an example of a configuration diagram of a processor implementing a memory device based on an embodiment of the disclosed technology.

FIG. 9 is an example of a configuration diagram of a processor implementing a memory device according to an embodiment of the disclosed technology.

Referring to FIG. 9, the processor 1100 may include various functions in addition to the functions of the microprocessor 1000 described above, and thus performance may be improved and multi-function may be implemented. The processor 1100 may include a core 1110 serving as a microprocessor, a cache memory 1120 temporarily store data, and a bus interface 1130 for transferring data between internal and external devices. The processor 1100 may include various system on chips (SoCs) such as a multi core processor, a graphic processing unit (GPU), and an application processor (AP).

The core 1110 of the present embodiment may be a part for performing an arithmetic logic operation on data input from an external device and may include a memory 1111, an operating component 1112, and a controller 1113. The memory 1111, the operating component 1112, and the controller 1113 may be substantially the same as the memory 1010, the operating component 1020, and the controller 1030 described above.

The cache memory 1120 temporarily stores data to compensate for a data process speed difference between the core 1110 operating at a high speed and an external device operating at a low speed. The cache memory 1120 may include a primary storage 1121 and a secondary storage 1122, and may include a tertiary storage 1123 when a high capacity is required. The cache memory 1120 may include more storages as needed. That is, the number of storages included in the cache memory 1120 may vary depending on design. Here, process speeds for storing and discriminating data in the primary, secondary, and tertiary storages 1121, 1122, and 1123 may be the same or different. When the process speeds of each storage are different, the speed of the primary storage may be the fastest. One or more of the primary storage section 1121, the secondary storage section 1122, and the tertiary storage section 1123 of the cache memory 1120 may include one or more embodiments of the semiconductor device described above. For example, the cache memory 1120 may include one or more memory element. The memory element may include a word line, a bit line crossing the word line, and a memory cell coupled between the word line and the bit line and including a switching material layer and an oxidation-reduction reversible material layer. The memory cell may have a first threshold voltage when an oxidation interface is generated between the switching material layer and the oxidation-reduction reversible material layer, and have a second threshold voltage different from the first threshold voltage when the oxidation interface dissipates. Therefore, reliability of the cache memory 1120 may be improved and a manufacturing process may be improved. As a result, an operation characteristic of the processor 1100 may be improved.

In the present embodiment, a case where all of the primary, secondary, and tertiary storages 1121, 1122, and 1123 are configured in the cache memory 1120 is shown. However, some or all of the primary, secondary, and tertiary storages 1121, 1122, and 1123 may be configured outside the core 1110 and compensate for the process speed difference between the core 1110 and the external device.

The bus interface 1130 connects the core 1110, the cache memory 1120, and an external device so as to efficiently transmit data.

The processor 1100 according to the present embodiment may include a plurality of cores 1110 and the plurality of cores 1110 may share the cache memory 1120. The plurality of cores 1110 and the cache memory 1120 may be directly connected to each other or may be connected to each other through the bus interface 1130. All of the plurality of cores 1110 may be configured identically to the core described above.

The processor 1100 according to the present embodiment may include an embedded memory 1140 that stores data, a communication module 1150 that may transmit and receive data in a wired manner or wirelessly with an external device, a memory controller 1160 that drives an external storage device, a media processor 1170 that processes data processed by the processor 1100 and input from an external input device and outputs the processed data to an external interface device, and the like. In addition, the processor 1100 may further include a plurality of modules and devices. In this case, the plurality of added modules may exchange data with the core 1110 and the cache memory 1120 through the bus interface 1130.

Here, the embedded memory 1140 may include a non-volatile memory as well as a volatile memory. The volatile memory may include a dynamic random access memory (DRAM), a mobile DRAM, a static random access memory (SRAM), a memory performing a function similar to that of these, and the like. The non-volatile memory may include a read only memory (ROM), a NOR flash memory, a NAND flash memory, a phase change random access memory (PRAM), a resistive random access memory (RRAM), a spin transfer torque random access memory (STTRAM), a magnetic random access memory (MRAM), a memory performing a function similar to that of these, and the like.

The communication module 1150 may include a module capable of connecting with a wired network, a module capable of connecting with a wireless network, and both of the modules capable of connecting with a wired network and the module capable of connecting with a wireless network. A wired network module may include a local area network (LAN), a universal serial bus (USB), an Ethernet, a power line communication (PLC), or the like, as various devices that transmit and receive data through a transmission line. A wireless network module may include an infrared data association (IrDA), a code division multiple access (CDMA), a time division multiple access (TDMA), a frequency division multiple access (FDMA), a wireless LAN, Zigbee, a ubiquitous sensor network (USN), Bluetooth, radio frequency identification (RFID), long term evolution (LTE), near field communication (NFC), wireless broadband Internet (WIBRO), high speed downlink packet access (HSDPA), wideband CDMA (WCDMA), ultra wide band (UWB), and the like, as various devices that transmit and receive data without a transmission line.

The memory controller 1160 is for processing and managing data transmitted between the processor 1100 and an external storage device operating according to a different communication standard. The memory controller 1160 may include various memory controllers, for example, a controller that controls integrated device electronics (IDE), serial advanced technology attachment (SATA), a small computer system interface (SCSI), redundant array of independent disks (RAID), a solid state disk (SSD), external SATA (eSATA), personal computer memory card international association (PCMCIA), a universal serial bus (USB), a secure digital (SD) card, a mini secure digital (mSD) card, a micro secure digital (micro SD) card, a secure digital high capacity (SDHC) card, a memory stick card, a smart media (SM) card, a multi-media card (MMC), an embedded MMC (eMMC), a compact flash (CF) card, and the like.

The media processor 1170 may process data processed by the processor 1100 and data input as an image, a voice, and other formats from an external input device, and may output the data to an external interface device. The media processor 1170 may include a graphics processing unit (GPU), a digital signal processor (DSP), high-definition audio (HD Audio), high-definition multimedia interface (HDMI) controller, and the like.

Figure 10:
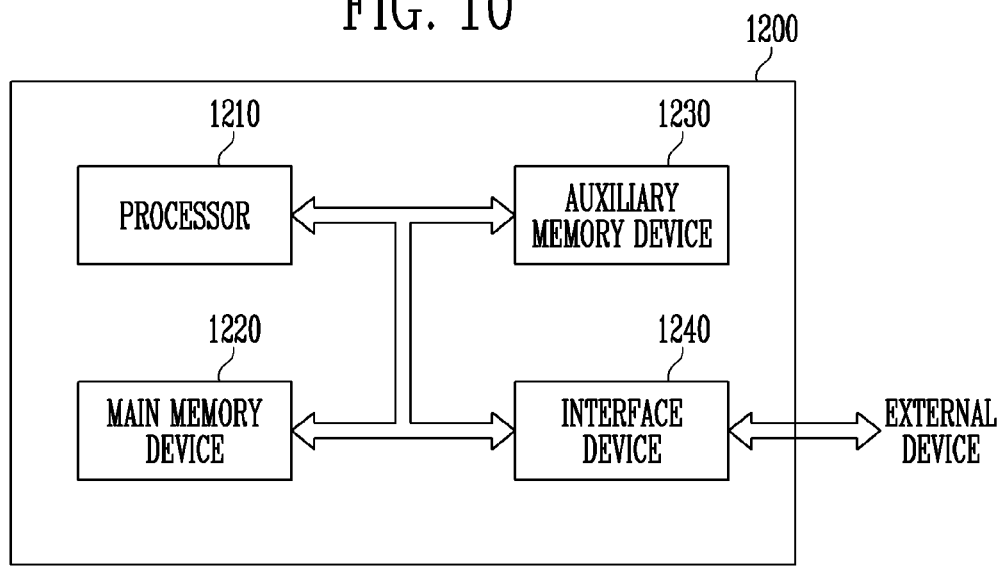
FIG. 10 is an example of a configuration diagram of a system implementing a memory device based on an embodiment of the disclosed technology.

FIG. 10 is an example of a configuration diagram of a system implementing a memory device according to an embodiment of the disclosed technology.

Referring to FIG. 10, the system 1200 is a device that processes data, and may perform input, process, output, communication, storage, and the like in order to perform a series of operations on data. The system 1200 may include a processor 1210, a main memory device 1220, an auxiliary memory device 1230, an interface device 1240, and the like. The system 1200 of the present embodiment may be various electronic systems operating using a processor, such as a computer, a server, a personal digital assistant (PDA), a portable computer, a web tablet, a wireless phone, a mobile phone, a smart phone, a digital music player, a portable multimedia player (PMP), a camera, a global positioning system (GPS), a video camera, a voice recorder, telematics, an audio visual system, a smart television, or the like.

The processor 1210 may control processes of analysis of an input command, an operation, comparison, and the like of data stored in the system 1200, and may be substantially the same as the microprocessor 1000 or processor 1100 described above.

The main memory device 1220 may be a memory space capable of moving, storing, and executing a program code or data from the auxiliary memory device 1230 when the program is executed. A stored content may be preserved even though power is shut off. The auxiliary memory device 1230 refers to a memory device for storing a program code or data. The auxiliary memory device 1230 is slower than the main memory device 1220 but may store a lot of data. The main memory device 1220 or the auxiliary memory device 1230 may include one or more embodiments of the electronic device described above. For example, the main memory device 1220 or the auxiliary memory device 1230 may include one or more memory elements. The memory element may include a word line, a bit line crossing the word line, and a memory cell coupled between the word line and the bit line and including a switching material layer and an oxidation-reduction reversible material layer. The memory cell may have a first threshold voltage when an oxidation interface is generated between the switching material layer and the oxidation-reduction reversible material layer, and have a second threshold voltage different from the first threshold voltage when the oxidation interface dissipates. Therefore, reliability of the main memory device 1220 or the auxiliary memory device 1230 may be improved and a manufacturing process may be improved. As a result, an operation characteristic of the system 1200 may be improved.

Figure 11:
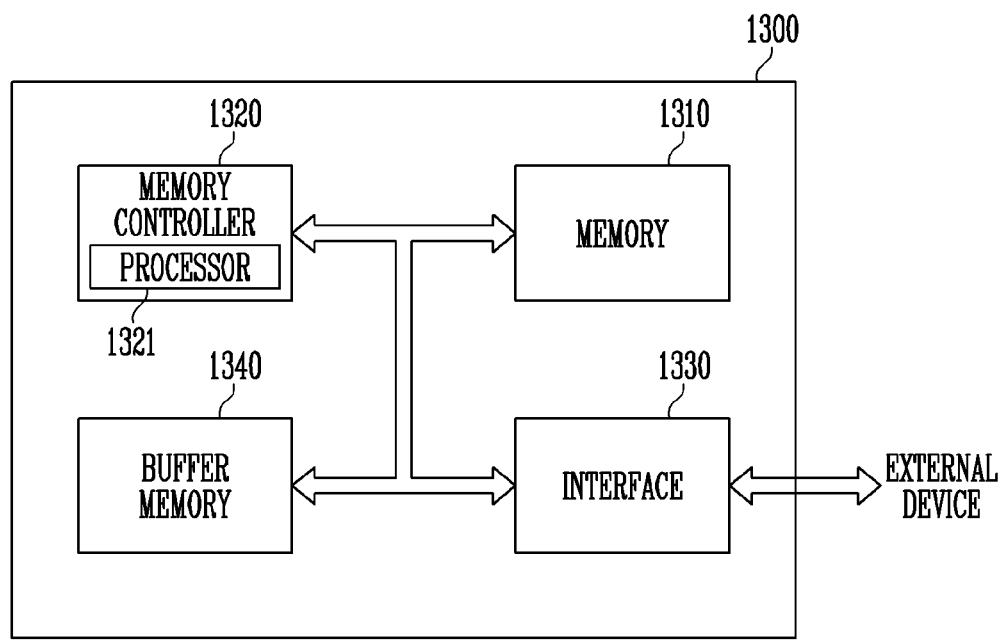
FIG. 11 is an example of a configuration diagram of a memory system implementing a memory device based on an embodiment of the disclosed technology.

In addition, the main memory device 1220 or the auxiliary memory device 1230 may include a memory system 1300 as shown in FIG. 11 in addition to the semiconductor device of the above-described embodiment or without the semiconductor device of the above-described embodiment.

The interface device 1240 may be for exchanging an instruction, data, and the like between the system 1200 of the present embodiment and an external device. The interface device 1240 may be a keypad, a keyboard, a mouse, a speaker, a microphone, a display, various human interface devices (HIDs), a communication device, and the like. The communication device may be substantially the same as the communication module 1150 described above.

FIG. 11 is an example of a configuration diagram of a memory system implementing a memory device according to an embodiment of the disclosed technology.

Referring to FIG. 11, the memory system 1300 may include a memory 1310 having a nonvolatile characteristic as a configuration for storing data, a memory controller 1320 for controlling the memory 1310, an interface 1330 for connection with an external device, and a buffer memory 1340 for temporarily storing data in order to efficiently transfer input/output of data between the interface 1330 and the memory 1310. The memory system 1300 may mean a memory for simply storing data, and further, may mean a data storage device that conserves stored data for a long time. The memory system 1300 may be a disk type such as a solid state disk (SSD), and a card type such as a universal serial bus (USB) memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded MMC (eMMC), and a compact flash (CF) card.

The memory 1310 or the buffer memory 1340 may include one or more embodiments of the semiconductor device described above. For example, the memory 1310 or the buffer memory 1340 may include one or more memory elements. The memory element may include a word line, a bit line crossing the word line, and a memory cell coupled between the word line and the bit line and including a switching material layer and an oxidation-reduction reversible material layer. The memory cell may have a first threshold voltage when an oxidation interface is generated between the switching material layer and the oxidation-reduction reversible material layer, and have a second threshold voltage different from the first threshold voltage when the oxidation interface dissipates. Therefore, reliability of the memory 1310 or the buffer memory 1340 may be improved and a manufacturing process may be improved. As a result, an operation characteristic of the memory system 1300 may be improved.

The memory 1310 or the buffer memory 1340 may include various volatile or nonvolatile memories in addition to the semiconductor device of the above-described embodiment or without the semiconductor device of the above-described embodiment.

The memory controller 1320 may control exchange of data between the memory 1310 and the interface 1330. To this end, the memory controller 1320 may include a processor 1321 that performs an operation or the like for processing commands input through the interface 1330 from the outside of the memory system 1300.

The interface 1330 is for exchanging an instruction, data, and the like between the memory system 1300 and an external device. When the memory system 1300 is a card type or a disk type, the interface 1330 may be compatible with interfaces used in such a card type or disk type device, or may be compatible with interfaces used in a device similar to the card type or disk type device. The interface 1330 may be compatible with one or more interfaces having different types.

What is claimed is:

1. A semiconductor device, comprising:
   a word line;
   a memory cell including an oxidation-reduction reversible material layer on the word line and a switching material layer on the oxidation-reduction reversible material layer, wherein the oxidation-reduction reversible material layer includes tantalum (Ta), hafnium (Hf), aluminum (Al), strontium (Sr), or ruthenium (Ru), or a combination thereof, and the switching material layer includes $SiO_2$, $Al_2O_3$, $TiO_2$, or $ZrO_2$, or a combination thereof; and
   a bit line
   on the switching material layer,
   wherein an oxidation interface is generated between the switching material layer and the oxidation-reduction reversible material layer when a reset voltage having a first polarity is applied to the word line or the bit line, and the oxidation interface is dissipated when a set voltage having a second polarity is applied to the word line or the bit line,
   wherein a threshold voltage of the memory cell is raised to a first threshold voltage when the oxidation interface is generated, and the threshold voltage is lowered to a second threshold voltage lower than the first threshold voltage when the oxidation interface is dissipated,
   wherein the memory cell having the first threshold voltage is configured to operate as a switching element, and
   wherein the memory cell having the second threshold voltage is configured to operate as a memory element.

2. The semiconductor device of claim 1, wherein the threshold voltage of the memory cell is changed from the first threshold voltage to the second threshold voltage by a set operation, and the threshold voltage of the memory cell is changed from the second threshold voltage to the first threshold voltage by a reset operation.

3. The semiconductor device of claim 2, wherein the reset voltage is applied to the word line or the bit line when the reset operation is performed, and the set voltage is applied to the word line or the bit line when the set operation is performed.

4. The semiconductor device of claim 3, wherein the oxidation interface includes a first surface contacting the switching material layer and a second surface contacting the oxidation-reduction reversible material layer, and a portion within the oxidation interface that is closer to the first surface than the second surface has a higher oxygen concentration than another portion within the oxidation interface that is closer to the second surface than the first surface.

5. The semiconductor device of claim 1, wherein the switching material layer includes a dopant and an insulating layer, wherein the dopant is included in the insulating layer.

6. The semiconductor device of claim 5, wherein the dopant includes boron (B), carbon (C), nitrogen (N), aluminum (Al), phosphorus (P), arsenic (As), silicon (Si), or germanium (Ge), or a combination thereof.

7. The semiconductor device of claim 5, wherein a concentration of the dopant is 1E14 to 1E17 $at/cm^2$.

8. The semiconductor device of claim 1, wherein a thickness of the switching material layer is 5 to 200 Å.

9. A method of operating a semiconductor device,
   wherein the semiconductor device includes a word line, a memory cell including an oxidation-reduction reversible material layer on the word line, a switching material layer on the oxidation-reduction reversible material layer, and a bit line on the switching material layer,
   wherein the method comprises:
   raising a threshold voltage of the switching material layer and the oxidation-reduction reversible material layer to a first threshold voltage by applying a reset voltage to the word line or the bit line to generate an oxidation interface between the switching material layer and the oxidation-reduction reversible material layer; and lowering the threshold voltage by applying a set voltage to the word line or the bit line to dissipate the oxidation interface to a second threshold voltage lower than the first threshold voltage, wherein the reset voltage has a positive voltage equal to or greater than 4V, and the set voltage has a negative voltage equal to or less than −4V, wherein the memory cell having the first threshold voltage is configured to operate as a switching element, and wherein the memory cell having the second threshold voltage is configured to operate as a memory element.

10. The method of claim 9, further comprising:
performing a read operation by applying a read voltage having a level between the first threshold voltage and the second threshold voltage.

11. The method of claim 9, wherein the oxidation-reduction reversible material layer includes tantalum (Ta), hafnium (Hf), aluminum (Al), strontium (Sr), or ruthenium (Ru), or a combination thereof.

12. The method of claim 9, wherein the oxidation interface includes a first surface contacting the switching material layer and a second surface contacting the oxidation-reduction reversible material layer, and a portion within the oxidation interface that is closer to the first surface than the second surface has a higher oxygen concentration than another portion within the oxidation interface that is closer to the second surface than the first surface.

13. A semiconductor device, comprising:
a stack including insulating layers and first conductive layers that are stacked alternately;
an oxidation-reduction reversible material layer disposed to pass through the stack and including tantalum (Ta), hafnium (Hf), aluminum (Al), strontium (Sr), or ruthenium (Ru), or a combination thereof;
a switching material layer passing through the oxidation-reduction reversible material layer and surrounded by the oxidation-reduction reversible material layer, the switching material layer including $SiO_2$, $Al_2O_3$, $TiO_2$, or $ZrO_2$, or a combination thereof; and
a second conductive layer disposed to pass through the switching material layer and surrounded by the switching material layer,
wherein an oxidation interface is generated between the switching material layer and the oxidation-reduction reversible material layer when a reset voltage is applied to the first conductive layers or the second conductive layer, and the oxidation interface is dissipated when a set voltage is applied to the first conductive layers or the second conductive layer, and
wherein a threshold voltage of the oxidation-reduction reversible material layer and the switching material layer is raised when the oxidation interface is generated, and the threshold voltage is lowered when the oxidation interface is dissipated.

14. The semiconductor device of claim 13, wherein the switching material layer includes a dopant included in the insulating layers.

15. The semiconductor device of claim 14, wherein the dopant includes boron (B), carbon (C), nitrogen (N), aluminum (Al), phosphorus (P), arsenic (As), silicon (Si), or germanium (Ge), or a combination thereof.

* * * * *